(12) United States Patent
Little et al.

(10) Patent No.: US 6,678,084 B2
(45) Date of Patent: Jan. 13, 2004

(54) METHODS OF MAKING MECHANISMS IN WHICH RELATIVE LOCATIONS OF ELEMENTS ARE MAINTAINED DURING MANUFACTURING

(75) Inventors: Michael J. Little, Oak Park, CA (US); William P. Eaton, Thousand Oaks, CA (US); Thomas S. Tyrie, Oak Park, CA (US); Harry Melkonian, Ventura, CA (US); Ping Li, Diamond Bar, CA (US)

(73) Assignee: NP Photonics, Inc., Tucson, AZ (US)

(*) Notice: Subject to any disclaimer, the term of this patent is extended or adjusted under 35 U.S.C. 154(b) by 0 days.

(21) Appl. No.: 10/124,716

(22) Filed: Apr. 18, 2002

(65) Prior Publication Data

US 2002/0196521 A1 Dec. 26, 2002

Related U.S. Application Data

(63) Continuation-in-part of application No. 10/085,143, filed on Mar. 1, 2002, which is a continuation-in-part of application No. 09/811,612, filed on Mar. 20, 2001, now Pat. No. 6,519,074, which is a continuation-in-part of application No. 09/766,687, filed on Jan. 19, 2001, now Pat. No. 6,597,461.

(60) Provisional application No. 60/190,110, filed on Mar. 20, 2000, provisional application No. 60/211,529, filed on Jun. 15, 2000, provisional application No. 60/284,943, filed on Apr. 20, 2001, and provisional application No. 60/303,772, filed on Jul. 10, 2001.

(51) Int. Cl.$^7$ ............ G02B 26/00; G02B 26/08
(52) U.S. Cl. ............ 359/290; 359/291; 359/295; 359/298; 359/224

(58) Field of Search ............... 359/290, 291, 359/295, 298, 292, 224, 226, 230; 372/20, 99, 43, 44, 50

(56) References Cited

U.S. PATENT DOCUMENTS

| 4,203,128 A | 5/1980 | Guckel et al. ............... 331/156 |
| 4,400,058 A | 8/1983 | Durand et al. ............... 359/359 |
| 4,553,816 A | 11/1985 | Durand et al. ............... 359/359 |

(List continued on next page.)

FOREIGN PATENT DOCUMENTS

| EP | 0 702 205 A2 | 8/1995 |
| WO | WO 99/34484 | 7/1999 |

OTHER PUBLICATIONS

Joost C. Lotters et al.; "Polydimethylisiloxane as an elastic material applied in a capacitive accelerometer"; (1996); J. Micromech. Microeng. 6 (1996) pp. 52–54.

(List continued on next page.)

Primary Examiner—Georgia Epps
Assistant Examiner—Jack Dinh
(74) Attorney, Agent, or Firm—Fleshner & Kim, LLP

(57) ABSTRACT

The present invention provides method of making mechanisms in which the relative locations of elements are maintained during manufacturing. The methods according to the present invention can be used to make a variety of devices, including tunable optical devices. The methods include displaceably attaching an island (support) to a frame with a non-rigid material.

49 Claims, 7 Drawing Sheets

U.S. PATENT DOCUMENTS

| | | | |
|---|---|---|---|
| 4,566,935 A | 1/1986 | Hornbeck | |
| 4,825,262 A | 4/1989 | Mallinson | 356/454 |
| 4,859,060 A | 8/1989 | Katagiri et al. | 356/454 |
| 5,068,861 A | 11/1991 | Abbott et al. | 372/20 |
| 5,313,333 A | 5/1994 | O'Brien et al. | |
| 5,381,232 A | 1/1995 | van Wijk | 356/519 |
| 5,383,168 A | 1/1995 | O'Brien et al. | |
| 5,461,507 A | 10/1995 | Westland et al. | 359/289 |
| 5,510,914 A | 4/1996 | Liu et al. | 349/136 |
| 5,561,523 A | 10/1996 | Blomberg et al. | 356/454 |
| 5,822,110 A | 10/1998 | Dabbaj | 359/293 |
| 5,917,647 A | 6/1999 | Yoon | |
| 5,970,190 A | 10/1999 | Fu et al. | 385/37 |
| 6,078,395 A | 6/2000 | Jourdain et al. | 356/519 |
| 6,137,819 A | 10/2000 | Najda | 372/96 |
| 6,324,192 B1 | 11/2001 | Tayebati | |
| 6,335,817 B1 | 1/2002 | Phillipps | |
| 6,400,738 B1 | 6/2002 | Tucker et al. | |
| 6,433,917 B1 * | 8/2002 | Mei et al. | 359/292 |
| 2003/0011866 A1 * | 1/2003 | Little et al. | 359/290 |

OTHER PUBLICATIONS

P. Bley; "Polymers—an Excellent and Increasingly Used Material for Microsystems"; Sep. 1999; SPIE vol. 3876; pp. 172–184.

Thorbjorn Ebeforst et al.; "New small radius joints based on thermal shrinkage of polyimide in V–grooves for robust self–assembly 3D microstructures"; J. Micromech. Microeng. 8 (1998); pp. 188–194.

M Pedersent et al.; "A capacitive differential pressure sensor with polyimide diaphragm"; J. Micromech. Microeng. 7 (1997); pp. 250–252.

Frank Niklaus et al.; "Low–temperature full wafer adhesive bonding"; J. Micromech. Microeng. 11 (2001); pp. 100–107.

Kenji Suzuki et al.; "Insect–Model Based Microrobot with Elastic Hinges"; Journal of Microelectromechanical Systems, vol. 3, No. 1, Mar. 1994; pp. 4–9.

K. Minami et al.; "Fabrication of Distributed Electrostatic Micro Actuator (DEMA)"; Journal of Microelectromechanical Systems, vol. 2, No. 3, Sep. 1993; pp. 121–127.

Cheol–Hyun Hang et al.; "Parylene–Diaphragm Piezoelectric Acoustic Transducers"; The Thirteenth Annual International Conference on Microelectromechanical Systems; (2000), pp. 148–152.

Krzysztof A R B Pietraszewski et al.; "Cryogenic servo–stabilised Fabry–Perot Interferometer for imaging at 2–2.5microns"; SPIE Proceedings, vol. 2814 (1996); pp. 139–146.

T R Hicks et al.; "The application of capacitance micrometry to the control of Fabry–Perot etalons"; J. Phys. E. Instrum., vol. 17, 1984, pp. 49–55.

P. Tayebati et al.; "Widely Tunable Fabry–Perot filter Using Ga(Al)As–AlO$_x$ Deformable Mirrors"; IEEE Photonics Technology Letters, vol. 10, No. 3, Mar. 1998; pp. 394–396.

P. Tayebati et al.; "Microelectromechanical tunable filters with 0.47nm linewidth and 70nm tuning range"; Electronics Letters; Jan. 8, 1998; vol. 34, No. 1; pp. 76–78.

M.C. Larson et al.; "Vertical Coupled–Cavity Microinterferometer on GaAs with Deformable–Membrane Top Mirror"; IEEE Photonics Technology Letters, vol. 7, No. 4, Apr. 1995; pp. 382–384.

K. Aratani et al.; "Process and Design Considerations for Surface Micromachined Beams for a Tunable Interferometer Array in Silicon"; Proc. IEEE Micro Electro Mechanical Systems, Ft. Lauderdal, FL, 1993, pp. 230–235.

MEM–TUNE Tunable Filter; Preliminary Data Sheet; May 2000.

OPM–1 Optical Performance Monitor; Preliminary Data Sheet; May 2000.

GTM–1 EDFA Gain–Tilt Monitor; Preliminary Data Sheet; May 2000.

J. H. Jerman et al.; "Miniature Fabry–Perot Interferometers Micromachined in Silicon for use in Optical Fiber WDM Systems"; Transducers '91, International Solid–State Conference on Sensors and Actuators, pp. 372–375 (1991) IEEE, pp. 472–475.

P. Tayebati; "Microelectromechanical tunable filter with stable haft symmetric cavity"; Electronics Letters—IEEE, 1998, p. 1967.

E. Ollier et al.; "Micro–Opto–Electro–Mechanical Systems: Recent developments and LETI's acitivities"; SPIE; vol. 4075; pp. 12–21. Sep. 2000.

T. R. Hicks et al.; "The application of capacitance micrometry to the control of Fabry–Perot etalons"; J. Phys. E: Sci. Instrum., vol. 17, 1984; pp. 49–55.

* cited by examiner

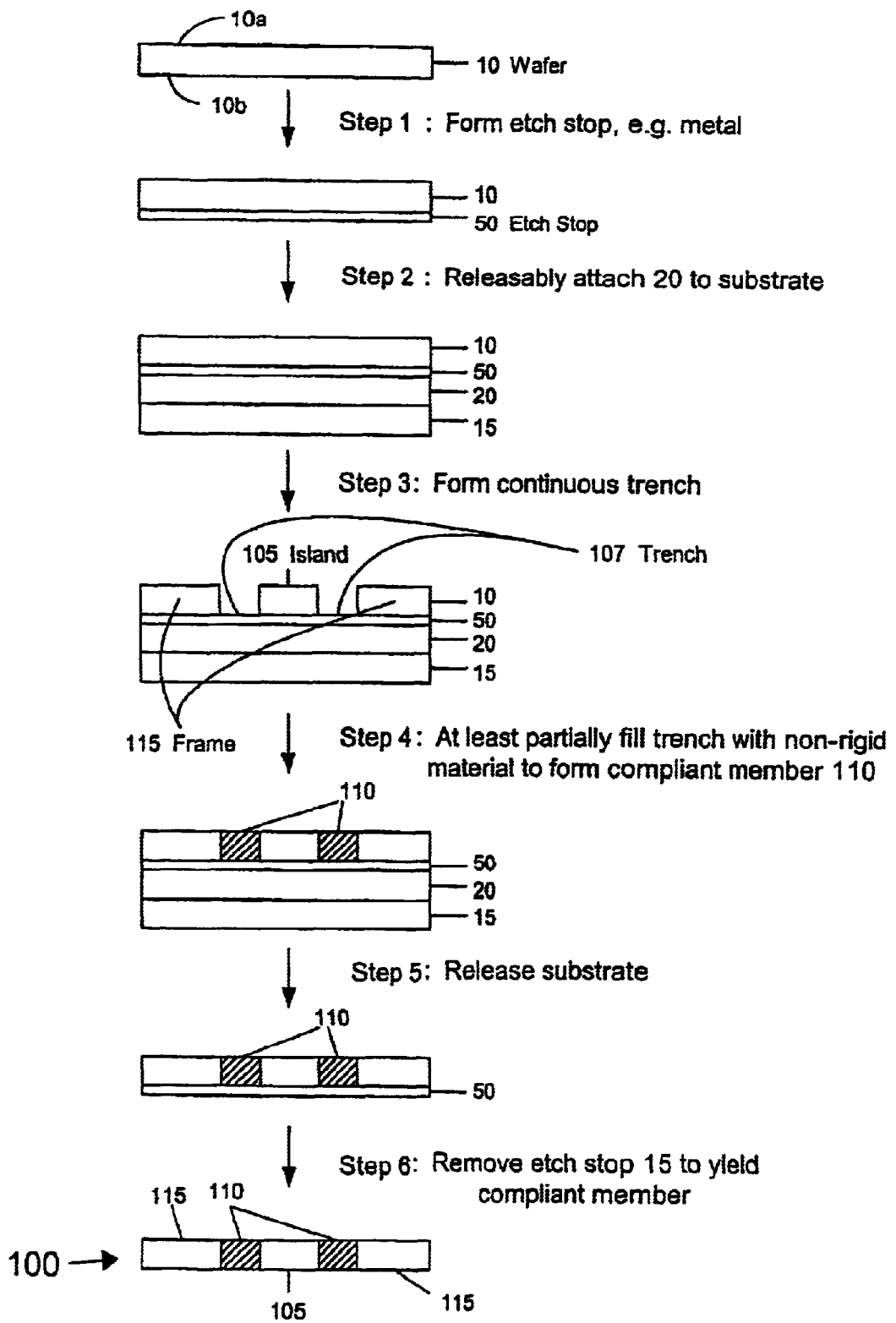

METHODS OF MAKING MECHANISMS IN WHICH RELATIVE LOCATIONS OF ELEMENTS ARE MAINTAINED DURING MANUFACTURING

RELATED APPLICATIONS

This application is a continuation-in-part of copending U.S. patent application Ser. No. 10/085,143, now U.S. Pat. No. 2003/0011866, filed Mar. 1, 2002 entitled "A Compliant Mechanism and Method of Forming Same", which is a continuation-in-part of U.S. patent application Ser. No. 09/811,612 now U.S. Pat. No. 6,519,074 entitled "A Electrostatically-Actuated Tunable Optical Components Using Entropic Materials," filed Mar. 20, 2001, which is a continuation-in-part of U.S. patent application Ser. No. 09/766,687 entitled "A Tunable Fabry-Perot Interferometer Using Entropic Materials," filed Jan. 19, 2001, now U.S. Pat. No. 6,597,461. U.S. Pat. No. 6,519,074 also claims priority to U.S. Provisional Application Serial Nos. 60/190,110, entitled "A Voltage Tunable Etalon Using Compliant Microelectromechanical System (MEMS) Technology," filed Mar. 20, 2000, and 60/211,529, entitled "A Elastomer Support Layer Based MEMS Devices," filed Jun. 15, 2000. This application also claims priority to U.S. Provisional Application Serial No. 60/284,943, filed Apr. 20, 2001, U.S. Provisional Application No. 60/303,772, filed Jul. 10, 2001 and U.S. Provisional Application No. 60/211.529 filed Jun. 15, 2000, All of the above applications are hereby by reference in their entirety.

BACKGROUND OF THE INVENTION

1. Field of the Invention

This invention relates to methods of making mechanisms, in which the precise relative locations of elements are maintained during manufacturing. The methods according to the present invention can be used to make a variety of devices where relative positioning of device elements is maintained during manufacturing. Examples include tunable optical elements, such as mirrors, lenses, filters, prisms and diffraction gratings for use in tunable optical devices.

2. Background of the Related Art

There is a continuing need for precise positioning of optical elements in devices for various applications, such as optical systems, including imaging systems and telecommunications networks. Such precise positioning offers benefits such as tunable devices and simplified packaging.

Existing technologies for forming mechanisms for positioning devices are too costly, unreliable, and/or do not exhibit the performance needed for present and/or future systems requirements.

SUMMARY OF THE INVENTION

An object of the invention is to solve at least the above problems and/or disadvantages and to provide at least the advantages described hereinafter.

The present invention provides methods of fabricating mechanisms that can be used to make a variety of positioning devices that are more reliable, more cost effective and/or exhibit better performance than prior fabrication methods.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 4 is a flow chart representing a method of making a compliant mechanism, according to the present invention;

DETAILED DESCRIPTION OF PREFERRED EMBODIMENTS

Figure 1:
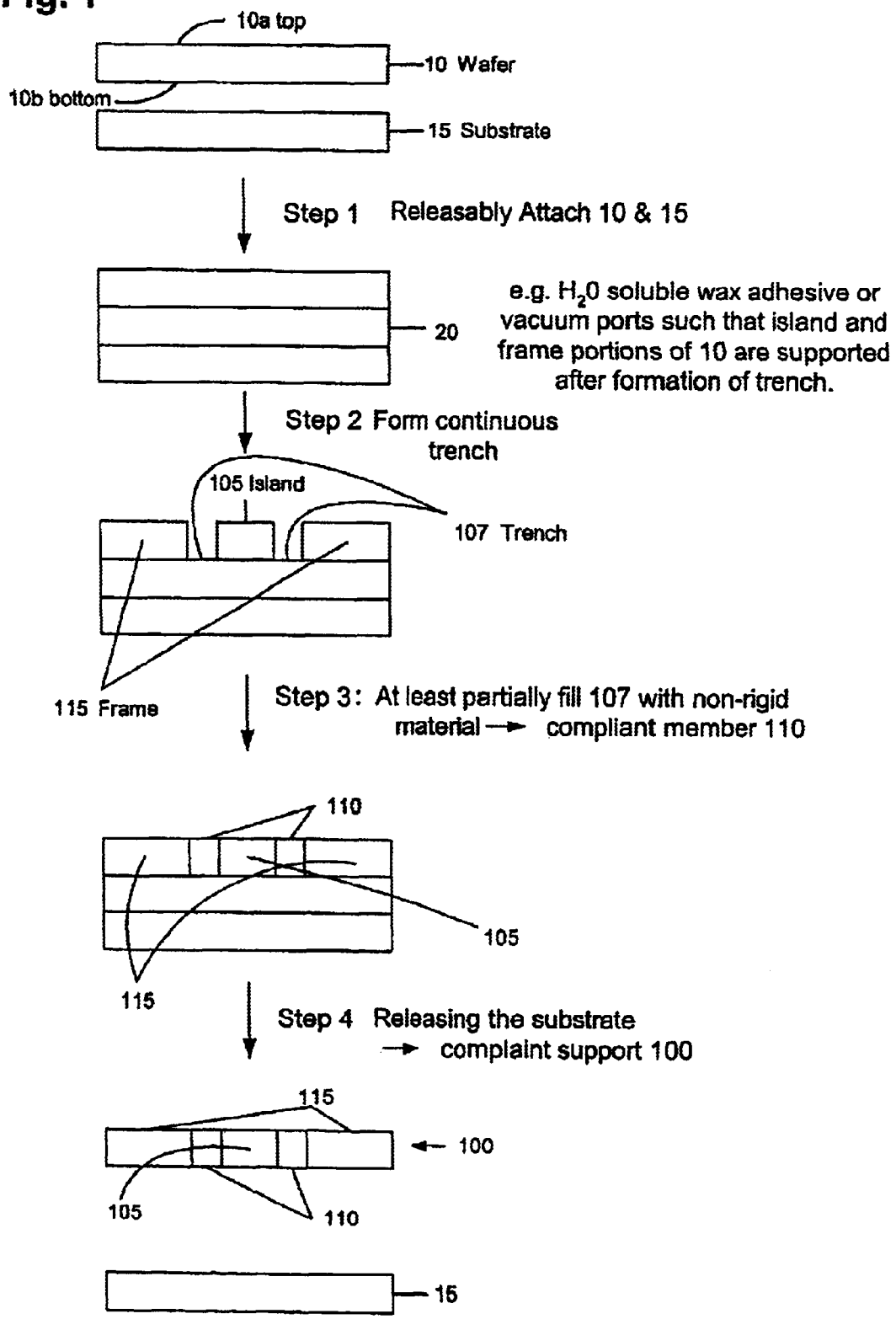
FIG. 1 is a flow chart representing a method of making a compliant mechanism, according to the present invention.

FIG. 1 shows a method of making a mechanism 100 according to the present invention. It should be appreciated that the compliant mechanism 100 is only one example of the types of mechanisms that can be made in accordance with the present invention. Non-compliant mechanisms can also be made with the methods of the present invention, as will be explained in more detail below. Further, it should be appreciated that, although the fabrication of a single compliant mechanism 100 is illustrated in the Figures and described below, the method of the present invention is designed so that a plurality of compliant mechanisms can be fabricated simultaneously on a single wafer. The methods of the present invention are preferably implemented with standard photolithographic and/or semiconductor processing techniques. A wafer 10 of a first material having a top 10a and a bottom 10b is releasably attached to a substrate 15. A continuous trench 107 is then formed in the wafer 10. The trench 107 extends from the top 10a to the bottom 10b of the wafer and forms an island 105 and a frame 115. The frame 115 is separated a distance from the island 105. Next, the trench 107 is at least partially filled with a second non-rigid material to form a compliant member 110. Finally, the substrate is released to yield a compliant mechanism 100. The compliant mechanism 100 includes the island 105 displaceably attached to the frame 115 by the compliant member 110. Although a non-rigid material is used to form a compliant member 110 in the embodiments of FIGS. 1–6B, it should be appreciated that any other type of connecting member, rigid or non-rigid, may be used to connect the island 105 to the frame 115, while still falling within the scope of the present invention.

The wafer 10 may be releasably attached to the substrate 15 in any way such as to allow separation of the substrate 15 from the compliant mechanism 100, such as by forming a releasable layer 20 between the wafer 10 and the substrate 15. The releasable layer 20 may include a releasably adhering material, such as, but not limited to, waxes, including organic and inorganic water soluble and water insoluble waxes, organic adhesives and water glass. Any material that can be removed, for example, by dissolution, heating, solubilizing or the like, without adversely affecting the island 105, the compliant member 110, the frame 115 and any other layers or materials contacting such material may be employed in practicing the present invention.

Figure 2:
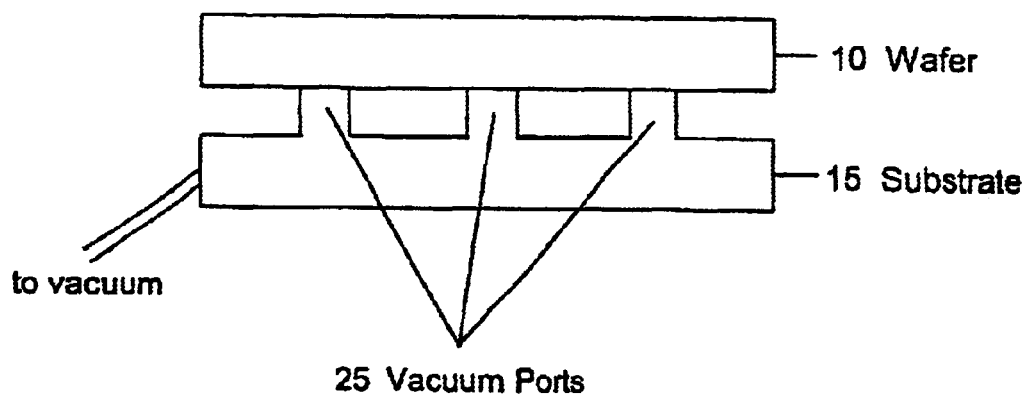
FIG. 2 is a cross-sectional view of a compliant mechanism releasably attached to a substrate by vacuum, made in accordance with the methods of the present invention.

In alternative embodiments, the wafer 10 may be releasably attached to the substrate 15 by vacuum, electrostatically or other mechanical means. For instance, as shown in FIG. 2, the substrate may include vacuum ports 25 arranged such that, after forming the trench 107, the portion of the wafer 10 forming the island 105 and the frame 115 are held in registration so as to maintain alignment until formation of the compliant member 110.

Figure 3:
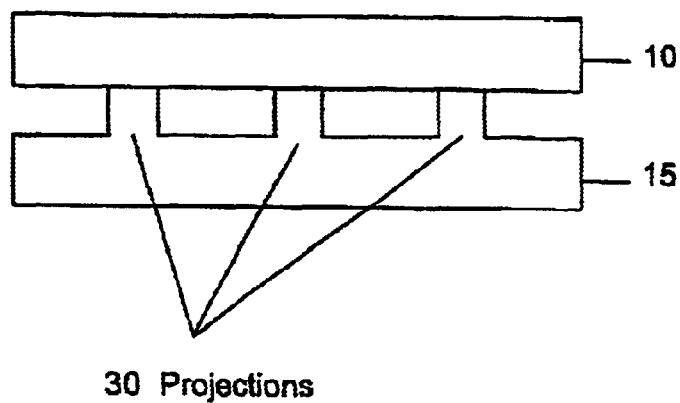
FIG. 3 is a cross-sectional view of a compliant mechanism releasably attached to a substrate by projections, made in accordance with the methods of the present invention.

Similarly, as shown in FIG. 3, the wafer 10 in alternative embodiments may be supported by projections 30 on the surface of the substrate 15. As with respect to the vacuum ports as described above, the projections may have any shape, such as circular, triangular, square, rectangular, star shaped and asymmetric, suitable to maintain the island 105 and frame 115 in registration following formation of the trench 107. The vacuum ports and projections may be used alone or in combination. Additionally, the vacuum ports and/or projections may be coated with materials, such as release agents, adhesive agents and the like.

According to certain preferred embodiments of the invention the wafer 10 is releasably attached to the substrate 15 by forming a water soluble wax layer therebetween. Water soluble waxes are usually solid at room temperature and typically comprise hydrocarbons, alcohols, fatty acids and esters. Examples of water soluble waxes include polyglycols and ethoxylated alkyl alcohols. Preferred examples of water soluble waxes include, but are not limited to, polyethylene oxide, polypropylene oxide, polyoxyethylene, polyoxypropylene and combinations of two or more thereof. Depending on the type of wax used for the releasable layer 20, a cooling mechanism, such as helium gas, may be needed to maintain the temperature of the structure low enough during etching to prevent melting of the wax. The thickness of the wax layer in preferred embodiments should be small enough to provide for sufficient thermal conduction, as desired. For example, where helium gas is used to cool the substrate 15, the wax conducts heat from the wafer 10 to the substrate 15 during etch.

The wafer 10 may be formed of a material that is opaque, translucent, or transparent to electromagnetic radiation. The wafer may be formed of a single material or have regions formed of different materials. For instance, the portions of the wafer 10 corresponding to the island 105 and the frame 115 after formation of the trench 107 may be made of different materials. Suitable materials include, but are not limited to, semiconductors, conductors, insulators, metals, glasses, ceramics and the like. In a preferred embodiment of the present invention, the wafer is formed entirely of silicon. Additionally, the island 105, compliant member 110 and frame 115 may be formed of the same material.

Additionally, the top 10a and/or bottom 10b of the wafer 10 may be treated prior to being releasably attached to the substrate 15. For instance, one or both sides of the wafer may be polished, roughened, chemically treated and the like. In the case where the wafer 10 is made of silicon, the wafer 10 is preferably polished prior to being releasably attached to the substrate 15.

According to certain preferred methods of the present invention, prior to releasably attaching the wafer 10 to the substrate 15, coating layers may be formed on the top 10a and/or bottom 10b of the wafer 10. Such coating layers include, but are not limited to, abrasion resistant layers, optical layers, metallic layers, organic layers, polymeric layers, ceramic layers, glass layers and the like. Exemplary coatings include electrodes, antireflectivity, highly reflective and non-conducting layers. The coating layers may be formed by any means known to those in the art, such as sputtering, chemical vapor deposition, plasma spraying, laser ablation, sol gel techniques, evaporation, spin coating and the like.

In a preferred embodiment of the present invention, as illustrated in FIG. 4, an etch stop layer 50 is formed on the bottom 10b of wafer 10 prior to releasably attaching coated wafer 10 to the substrate 15. The etch stop layer 50 is particularly preferred when deep reactive ion etching (DRIE) is employed to form the continuous trench 107. The etch stop layer 50 is preferably formed of a material that is sufficiently different from the other materials in the wafer 10 and any coating layers formed thereon such that the etch stop layer 50 can be removed following fabrication of the compliant member 110 without damaging the other materials. Preferably, the etch stop layer 50 is metal or a metal alloy. More preferably, the etch stop layer 50 is aluminum. The etch stop layer 50 protects the substrate 15 and the means by which the wafer 10 is releasably attached to the substrate, e.g., a water soluble wax, vacuum ports, projections of the like, from being etched during DRIE processing. The etch stop layer 50 can further function to horizontally distribute heat in a trench being etched, so that the heat is more evenly distributed across the means by which the wafer 10 is releasably attached to the substrate 15.

As further shown in FIG. 4, in this preferred embodiment of the invention, the etch stop layer 50 may be removed following releasing the substrate 15 from the wafer 10 to yield the compliant mechanism 100. Additionally, the etch stop layer 50 may be patterned, e.g., dimpled or cross-hatched, to impart a desired surface morphology to the compliant member 110 following removal of the etch stop layer 50.

According to certain preferred embodiments of the present invention, an optical element may be formed on the island 105. Examples of optical elements include, but are not limited to, fully reflective mirrors, partially reflective mirrors, gratings, holograms, waveguides and the like. The optical element may be formed on either the top 10a or the bottom 10b of the island 105 and may be formed either prior to releasably attaching the wafer 10 to the substrate 15, after releasing the substrate 15 or at any other suitable point during fabrication. For instance, if an optical element is formed on the top 10a of the wafer 10, the optical element may be formed after releasably attaching the wafer 10 to the substrate 15 but before releasing the substrate 15. The optical element may be formed by any suitable means known to those in the art such as by metallic bonding, e.g., soldering, adhering with inorganic or organic adhesives, and the like.

The continuous trench 107 extends from the top 10a to the bottom 10b of the wafer and is formed by removing a portion of the wafer 10 so as to provide an island 105 and a frame 115. The trench 107 may be formed, for instance, by etching, dissolving or cutting away by any suitable means a portion of the wafer 10. The trench 107 separates the island 105 from the frame 115. However, according to the present invention, the island 105 and frame 115 remain in registration with one another, since the wafer 10 is releasably attached to and supported by the substrate 15.

Additionally, other wells, apertures, trenches, depressions and the like, may be formed in the wafer 10, for instance, to reduce the weight of the compliant mechanism 100. These wells, apertures, trenches, depressions and the like, may extend all the way from the top 10a to the bottom 10b of the wafer 10 or may extend only part of the way between the top 10a and bottom 10b of the wafer. Additionally, these additional wells, apertures, trenches, depressions and the like may be formed either on the top 10a or the bottom 10b of the wafer 10. The other wells, apertures, trenches, depressions and the like, may be formed at any point during fabrication, including after releasing the substrate 15 to yield the compliant mechanism 100. The wells, apertures, trenches, depressions and the like may be formed by means conventional in the art, such as etching, dissolution and the like.

The trench 107 is then at least partially filled with a non-rigid material to form a compliant member 110. The trench may be filled by any suitable manner. For instance, the non-rigid material may be introduced into the trench in a solid state and melted to conform to and at least partially fill the trench 107. In certain preferred embodiments of the present invention, the non-rigid material is introduced into the trench 107 in a liquid state and cured such that the resulting compliant member 110 is bonded to the walls of the trench 107. In a preferred embodiment, the non-rigid material in its liquid state is injected into the trench 107. To aid in injecting the non-rigid material into the trench 107, guide channels (108 in FIG. 5A) may be formed in or on the island 105 and/or frame 115 to aid in directing the non-rigid material into the trench 107. Such guide channels 108 are of particular benefit when the width of the trench 107 is small. One or more larger size guide channels 108 are formed to allow injection of the liquid. The liquid pours from the aperture of the guide channel 108 through the channel and into the trench 107. When the non-rigid material is introduced into the trench 107 in a liquid state, the inner parameter of the frame 115 and the outer parameter of the island 105 function as sides of a mold for the non-rigid material. The etch stop 50, releasable layer 20 and substrate 15 function as the bottom of the mold. The non-rigid material is preferably filled to near the top of the trench 107. However, it should be appreciated that the ability to partially fill the trench 107 with lease non-rigid material provides flexibility in choosing characteristics of the compliant member 110.

The non-rigid material may include processing aids, such as cross-linking agents, viscosity modifying agents, fillers, colorants and the like. The compliant member 110 may be formed of a single material or a mixture of materials. Additionally, the compliant member 110 may be formed of a plurality of layers of the same or different materials.

Figure 5A:
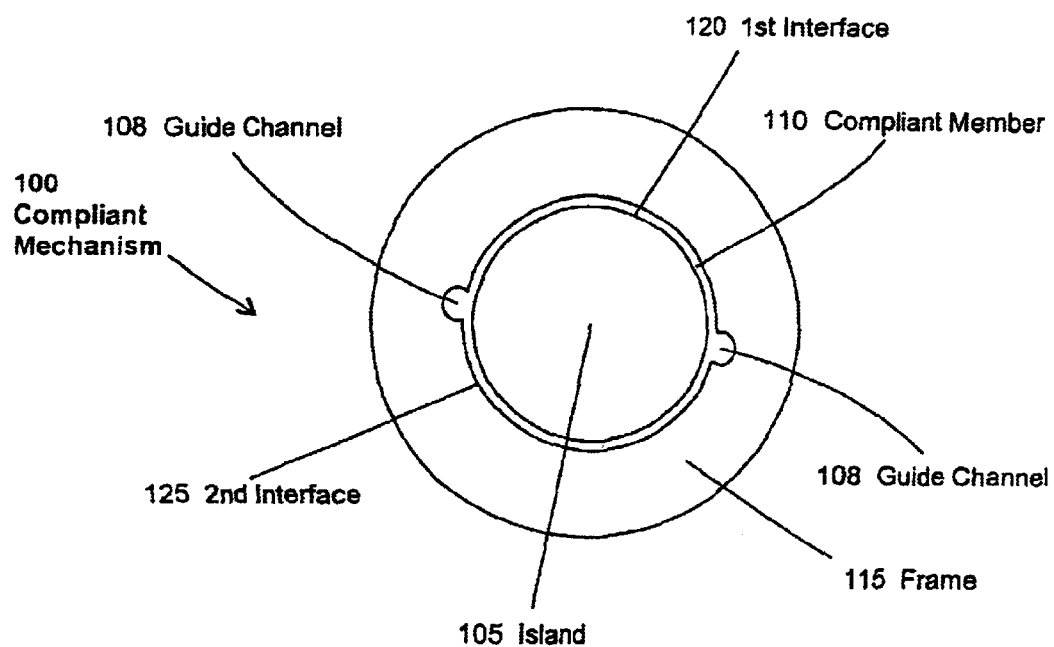
FIG. 5A is a plan view of a compliant mechanism made in accordance with the methods of the present invention.
Figure 5B:
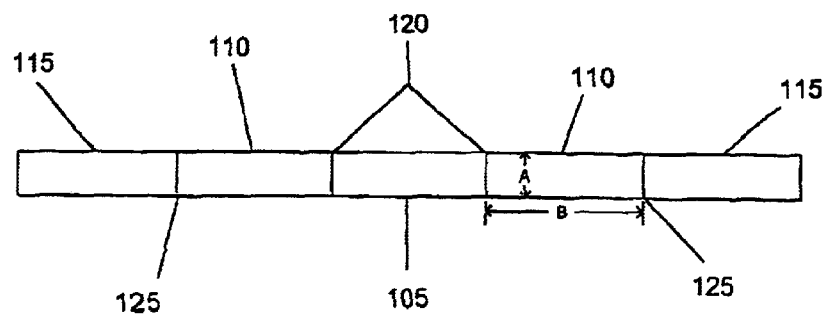
FIG. 5B is a cross-sectional view of a compliant mechanism made in accordance with the methods of the present invention.

FIG. 5A shows an overhead view of one embodiment of a compliant mechanism 100 made according to methods of the present invention. The compliant mechanism 100 includes an island 105 surrounded by and connected to a compliant member 110. The compliant member is surrounded by and connected to a frame 115. The interface where the island 105 meets the compliant member 110 is the first interface 120 and the interface where the compliant member 110 meets the frame 115 is the second interface 125. The compliant member is attached to the island 105 and the frame 115 at least at one point along the first interface 120 and the second interface 125, respectively. FIG. 5B shows a cross sectional view of the compliant mechanism 100 illustrated in FIG. 5A.

Figure 5C:
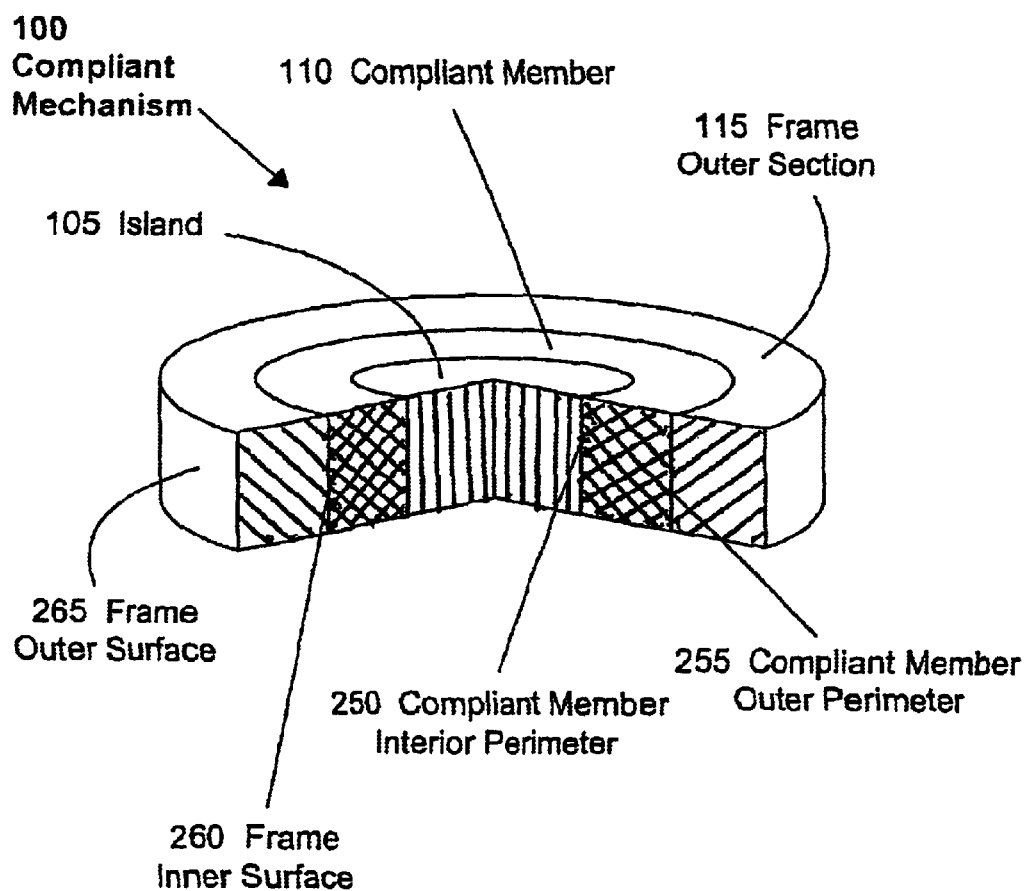
FIG. 5C is a partial cross-sectional view of compliant mechanism made in accordance with the methods of the present invention.

As shown in FIG. 5C, the compliant member 110 has a compliant member interior perimeter 250 and a compliant member outer perimeter 255. The compliant member interior perimeter 250 and the compliant member outer perimeter 255 define the inner and outer boundaries, respectively, of the compliant member 110. The compliant member interior perimeter 250 and compliant member outer perimeter 255 may have any symmetric or asymmetric shape, including, but not limited to, circular, oval, square, rectangular, star shaped, triagonal and the like. Moreover, the compliant member interior perimeter 250 and the compliant member outer perimeter 255 may have the same shape or different shapes.

The frame section 115 includes a frame outer surface 265 and a frame inner surface 260 defining the outer and inner boundaries, respectively, of the frame 115. The frame outer surface 265 and the frame inner surface 260 may have any symmetric or asymmetric shape, including but not limited to circular, oval, square, rectangular, star shaped, triagonal and the like. Moreover, the frame outer surface 265 and the frame inner surface 260 may have the same shape or different shapes.

Figure 6A:
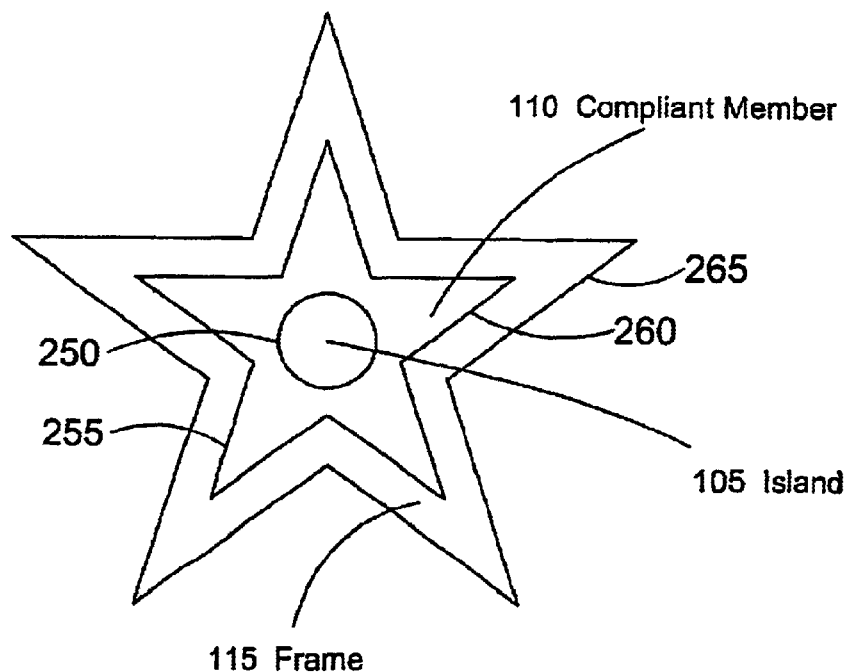
FIGS. 6A–6C are plan views of mechanisms made in accordance with the methods of the present invention.
Figure 6B:
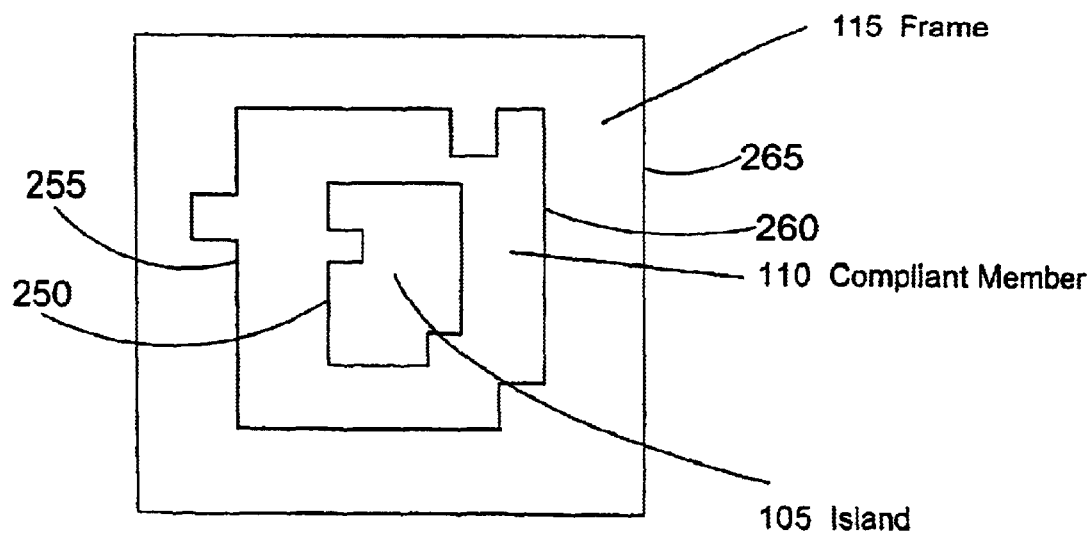

FIGS. 6A and 6B show compliant mechanisms made according to embodiments of the present invention wherein the compliant member interior perimeter 250, the compliant member outer perimeter 255, the frame outer surface 265 and/or the frame inner surface 260 have different shapes.

The compliant member 110 is preferably formed from a material that is less rigid than the island 105 and the frame 115. The compliant member 110 is preferably an elastic material with a Young's modulus smaller than the Young's modulus of the island 105 and frame 115 and preferably has a relatively high elastic limit. In one preferred embodiment, the Young's modulus of the compliant member 110 is preferably less than approximately 1 G Pascal. In embodiments where it is desirable to maintain the rigidity of the island 105 while the compliant member 110 is deformed, it is preferred that the Young's modulus of the island 105 is at least two orders of magnitude larger than the Young's modulus of the compliant member 110.

In certain preferred embodiments of the present invention, the compliant member 110 is formed of an entropic material. Preferably, the entropic material is an elastomer, such as natural rubbers, synthetic rubbers and silicones, a long chain homopolymer, a block copolymer or an aerogel, such as silica, alumina or silica/alumina aerogels. Elastomers can have a Young's modulus as much as five orders of magnitude less than the Young's modulus of a typical silicon substrate.

To achieve a wide tuning range, in instances where the compliant mechanism 100 is to be used in a tunable optical device, compliant member 110 should preferably display linear-elastic behavior over a wide range of frequencies and over a substantial portion of the deformation range at low actuation forces. Entropic materials are one type of material which provides such behavior.

Taking advantage of entropic materials' normal stress behavior can further enhance stability of the island 105. To achieve this benefit, the compliant member 110 is preferably configured such that it undergoes shear deformation. For example, when a unit volume of such an entropic material is subjected to shear deformation, it displays normal stresses acting perpendicular to the three orthogonal unit planes. These normal stresses are in addition to the shear stress displayed by all materials, and are a consequence of the long chain nature of the entropic material (i.e. the causality of the normal stress behavior is identical to the causality of the entropic elastic behavior). Further, the magnitude of the normal stress is proportional to the square of the shear strain, which compares to the shear stress being directly proportional to the shear strain. This feature can be used to further enhance device stability.

The use of entropic materials for tunable devices is discussed in more detail in copending related U.S. Pat. Nos. 6,529,074 and 6,579,461, both of which are incorporated by reference in their entirety.

An important characteristic of the compliant 110 is its aspect ratio. The aspect ratio of the compliant member 110 is the height A, shown in FIG. 5B, of the compliant member's aspect ratio, the compliant member 110 will exhibit certain mechanical characteristics, such as flexing primarily in shear or tension. By altering the aspect ratio, certain types of motion of the island 105 can be suppressed or mitigated, and other types of motion of the island 105 can be enhanced or selected. For instance, when the aspect ratio of the compliant member 110 is less than one, the compliant member 110 will operate in diaphragm mode and when the aspect ratio is greater than one it will operate in shear mode.

Referring to FIG. 5C, the cross-section of the compliant mechanism 100 shows the compliant member interior perimeter 250 and compliant member outer perimeter 255 as being substantially parallel. However, it should be appreciated that these two surfaces may have any geometrical relationship with respect to one another. Thus, the compliant member interior perimeter 250 and compliant member outer perimeter 255 need not be parallel, but can also be non-parallel, including any symmetric or asymmetric shapes.

Finally, the substrate 15 is released to yield the island 105 displaceably attached to the frame 115 by the compliant member 110. The way by which the substrate 15 may be released is dependent upon the manner of releasably attaching the wafer 10 to the substrate 15. For instance, water soluble waxes may be dissolved with water, non-water soluble waxed may be melted by heating and a vacuum may be pressurized to release the substrate. The method of release may readily be determined by the ordinary worker in the art and will depend, among other things, upon the manner of releasably attaching the wafer 10 to the substrate 115, e.g., the materials and conditions employed.

Figure 6C:
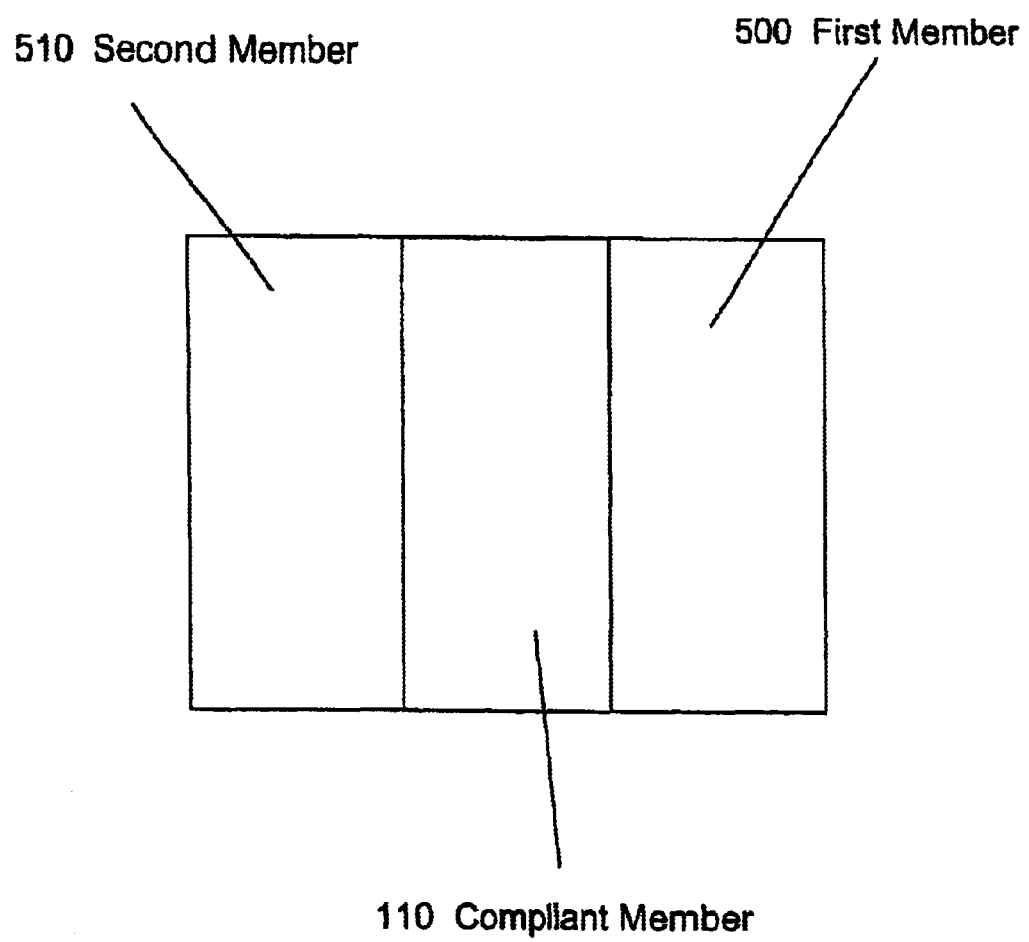

The preferred embodiments herein show a first member island and a second member frame. However, numerous other geometries and relative positions are possible utilizing the present invention, as shown in the embodiment of FIG. 6C. In the FIG. 6C embodiment, a first member 500 is located parallel to a second member 510 with a compliant member 110 connecting the first element 500 and the second element 510. More than two elements may also be connected, in accordance with the present invention, in a single device.

The foregoing embodiments and advantages are merely exemplary and are not to be construed as limiting the present invention. The present teaching can be readily applied to other types of apparatuses. For example, as discussed above, the methods of the present invention can be used to manufacture non-compliant mechanisms, in which any type of connecting member may be used to connect the island and the frame. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of making a mechanism comprising:
    releasably attaching a wafer of a first material to a substrate, wherein said wafer comprises a top and a bottom;
    forming a continuous trench in said wafer, wherein said trench extends from said top to said bottom of said wafer to produce a first element of said first material separated a distance from a detached second element of said first material;
    connecting said first element to said second element with a connecting member; and
    releasing said substrate to yield said first element attached to said second element by said connecting member.
2. The method according to claim 1, wherein the step of connecting said first element to said second element with a connecting member comprises at least partially filling said trench with a second non-rigid material, thereby forming a compliant member that displaceably attaches said first member to said second member.
3. The method according to claim 2, wherein said non-rigid material comprises an entropic material.
4. The method according to claim 3, wherein said entropic material is selected from the group consisting of elastomers, long chain homopolymers, block copolymers and aerogels.
5. The method according to claim 4, wherein said elastomer is selected from the group consisting of natural rubbers, synthetic rubbers and silicones.
6. The method according to claim 2, wherein said wafer is more rigid than said non-rigid material.
7. The method according to claim 2, wherein said non-rigid material has a Young's modulus lower than the Young's modulus of said first member or said second member.
8. The method according to claim 7, wherein said non-rigid material has a Young's modulus of less than approximately 1 G Pascal.
9. The method according to claim 2, wherein said compliant member has an aspect ratio of greater than about 1.
10. The method according to claim 2, wherein said compliant member has an aspect ratio of less than about 1.
11. The method according to claim 1, wherein said first member comprises an island, and said second member comprises a frame.
12. The method according to claim 1, wherein said wafer is releasably attached to said substrate by a water soluble wax.
13. The method according to claim 12, wherein said water soluble wax is selected from the group consisting of polyethylene oxide, polypropylene oxide, polyoxyethylene, polyoxypropylene and combinations thereof.
14. The method according to claim 1, wherein an etch stop layer is formed on the bottom of said wafer prior to releasably attaching said wafer to said substrate.
15. The method according to claim 14, wherein said etch stop layer is aluminum.
16. The method according to claim 14, wherein said etch stop layer is removed following releasing said substrate.
17. A method of making a support having an island attached to an outer region, comprising:
    releasably attaching a wafer of a first material to a substrate, wherein said wafer comprises a top and a bottom;
    forming a continuous trench in said wafer, wherein said trench extends from said top to said bottom of said wafer to produce a first element of said first material separated a distance from an outer region of said first material;

connecting said first element to said outer region of said first material with a connecting member; and releasing said substrate to yield said first element attached to said outer region by said connecting member.

18. The method according to claim 17, wherein the step of connecting said first element to said outer region of said first material with a connecting member comprises at least partially filling said trench with a second non-rigid material, thereby forming a compliant member that attaches said first element to said outer region.

19. The method according to claim 18, wherein said non-rigid material comprises an entropic material.

20. The method according to claim 19, wherein said entropic material is selected from the group consisting of elastomers, long chain homopolymers, block copolymers and aerogels.

21. The method according to claim 20, wherein said elastomer is selected from the group consisting of natural rubbers, synthetic rubbers and silicones.

22. The method according to claim 18, wherein said wafer is more rigid than said non-rigid material.

23. The method according to claim 18, wherein said non-rigid material has a Young's modulus lower than the Young's modulus of said island and said frame.

24. The method according to claim 23, wherein said non-rigid material has a Young's modulus of less than about approximately 1 G Pascal.

25. The method according to claim 18, wherein said compliant member has an aspect ratio of less than about 1.

26. The method according to claim 18, wherein said compliant member has an aspect ratio of greater than about 1.

27. The method according to claim 17, wherein said wafer is releasably attached to said substrate by a water soluble wax.

28. The method according to claim 27, wherein said water soluble wax is selected from the group consisting of polyethylene oxide, polypropylene oxide, polyoxyethylene polyoxypropylene and combinations thereof.

29. The method according to claim 17, wherein an etch stop layer is formed on the bottom of said wafer prior to releasably attaching said wafer to said substrate.

30. The method according to claim 29, wherein said etch stop layer is aluminum.

31. The method according to claim 29, wherein said etch stop layer is removed following releasing said substrate.

32. A method of suspending a support, comprising:

attaching said support to an element with a non-rigid material such that said non-rigid material is loaded substantially in shear when said support is displaced from a neutral position.

33. The method according to claim 32, wherein said support is attached to said element by:

releasably attaching a wafer of a first material to a substrate, wherein said wafer comprises a top and a bottom;

forming a continuous trench in said wafer, wherein said trench extends from said top to said bottom of said wafer to produce a support of said first material separated a distance from an element of said first material;

at least partially filling said trench with said non-rigid material, thereby forming a compliant member attaching said support to said element; and releasing said substrate to yield said support attached to said element by said compliant member.

34. The method according to claim 33, wherein said wafer is releasably attached to said substrate by a water soluble wax.

35. The method according to claim 34, wherein said water soluble wax is selected from the group consisting of polyethylene oxide, polypropylene oxide, polyoxyethylene polyoxypropylene and combinations thereof.

36. The method according to claim 33, wherein said non-rigid material comprises an entropic material.

37. The method according to claim 36, wherein said entropic material is selected from the group consisting of elastomers, long chain homopolymers, block copolymers and aerogels.

38. The method according to claim 37, wherein said elastomer is selected from the group consisting of natural rubbers, synthetic rubbers and silicones.

39. The method according to claim 33, wherein said wafer is more rigid than said non-rigid material.

40. The method according to claim 33, wherein said non-rigid material has a Young's modulus lower than the Young's modulus of said island and said frame.

41. The method according to claim 40, wherein said non-rigid material has a Young's modulus of less than approximately 1 G Pascal.

42. The method according to claim 33, wherein an etch stop layer is formed on the bottom of said wafer prior to releasably attaching said wafer to said substrate.

43. The method according to claim 42, wherein said etch stop layer is aluminum.

44. The method according to claim 42, wherein said etch stop layer is removed following releasing said substrate.

45. A method of making a mechanism, comprising:

releasably attaching a wafer of a first material to a substrate, wherein said wafer comprises a top and a bottom;

forming a continuous trench in said wafer, wherein said trench extends from said top to said bottom of said wafer to produce a first element of said first material separated a distance from a detached second element of said first said material;

performing at least one additional processing step on said first or second element; and releasing said substrate.

46. The method according to claim 45, wherein the first element comprises an island, and the second element comprises a frame.

47. The method according to claim 45, wherein the at least one additional processing step comprises forming at least one well in at least one of either a top or a bottom surface of the wafer.

48. The method according to claim 45, wherein the at least one additional comprises at least partially filling said trench with at least one non-rigid material.

49. The method according to claim 48, wherein said trench is filled with a plurality of layers of non-rigid materials.

* * * * *